(12) United States Patent
Gaudin

(10) Patent No.: US 12,087,631 B2
(45) Date of Patent: Sep. 10, 2024

(54) METHOD FOR PRODUCING A COMPOSITE STRUCTURE COMPRISING A THIN MONOCRISTALLINE LAYER ON A CARRIER SUBSTRATE

(71) Applicant: Soitec, Bernin (FR)

(72) Inventor: Gweltaz Gaudin, Crolles (FR)

(73) Assignee: SOITEC, Bernin (FR)

( * ) Notice: Subject to any disclaimer, the term of this patent is extended or adjusted under 35 U.S.C. 154(b) by 261 days.

(21) Appl. No.: 17/757,797

(22) PCT Filed: Dec. 15, 2020

(86) PCT No.: PCT/FR2020/052451
§ 371 (c)(1),
(2) Date: Jun. 21, 2022

(87) PCT Pub. No.: WO2021/136894
PCT Pub. Date: Jul. 8, 2021

(65) Prior Publication Data
US 2022/0359293 A1    Nov. 10, 2022

(30) Foreign Application Priority Data

Dec. 30, 2019 (FR) ...................................... 1915720

(51) Int. Cl.
*H01L 21/78* (2006.01)
*H01L 21/02* (2006.01)
(Continued)

(52) U.S. Cl.
CPC .... *H01L 21/7806* (2013.01); *H01L 21/02027* (2013.01); *H01L 21/187* (2013.01);
(Continued)

(58) Field of Classification Search
CPC ............ H01L 21/02027; H01L 21/187; H01L 21/2007; H01L 21/3247; H01L 21/7806;
(Continued)

(56) References Cited

U.S. PATENT DOCUMENTS 5,236,118 A * 8/1993 Bower .................. H01L 23/544
438/455
2002/0123204 A1    9/2002 Torvik
(Continued)

OTHER PUBLICATIONS

International Search Report for International Application No. PCT/FR2020/052451 dated Apr. 19, 2021, 3 pages.
(Continued)

*Primary Examiner* — Robert G Bachner
*Assistant Examiner* — Molly K Reida
(74) *Attorney, Agent, or Firm* — TraskBritt

(57) ABSTRACT

A method for producing a composite structure comprises providing a donor substrate including a single-crystal material, and a support substrate having a first alignment pattern on a face or edge of the support substrate. A heat treatment is applied at least to the donor substrate to bring about a surface reorganization on at least one face of the donor substrate. The surface reorganization results in formation of first steps of nanometric amplitude, which are parallel to a first main axis. The donor substrate and the support substrate are optically aligned, to better than ±0.1° between a locating mark indicating the first main axis on the donor substrate and at least one alignment pattern of the support substrate. The donor substrate and the support substrate are then assembled together, and a thin layer is transferred from the donor substrate onto the support substrate.

15 Claims, 4 Drawing Sheets

(51) Int. Cl.
  *H01L 21/18*  (2006.01)
  *H01L 21/324* (2006.01)
  *H01L 23/544* (2006.01)
  *H01L 29/16*  (2006.01)
  *H01L 29/20*  (2006.01)

(52) U.S. Cl.
  CPC ........ *H01L 21/3247* (2013.01); *H01L 23/544* (2013.01); *H01L 29/1608* (2013.01); *H01L 29/20* (2013.01); *H01L 2223/54426* (2013.01)

(58) Field of Classification Search
  CPC ......... H01L 23/544; H01L 2223/54426; H01L 2223/54453; H01L 2223/54493
  See application file for complete search history.

(56) References Cited

U.S. PATENT DOCUMENTS

| | | | |
|---|---|---|---|
| 2004/0151917 A1 | 8/2004 | Chen et al. | |
| 2005/0101095 A1* | 5/2005 | Fournel | H01L 21/187 438/305 |
| 2018/0323069 A1 | 11/2018 | Schindler | |

OTHER PUBLICATIONS

International Written Opinion for International Application No. PCT/FR2020/052451 dated Apr. 19, 2021, 6 pages.

* cited by examiner

METHOD FOR PRODUCING A COMPOSITE STRUCTURE COMPRISING A THIN MONOCRISTALLINE LAYER ON A CARRIER SUBSTRATE

CROSS-REFERENCE TO RELATED APPLICATIONS

This application is a national phase entry under 35 U.S.C. § 371 of International Patent Application PCT/FR2020/052451, filed Dec. 15, 2020, designating the United States of America and published as International Patent Publication WO 2021/136894 A1 on Jul. 8, 2021, which claims the benefit under Article 8 of the Patent Cooperation Treaty to French Patent Application Serial No. FR1915720, filed Dec. 30, 2019.

TECHNICAL FIELD

The present disclosure relates to the field of semiconductor materials for microelectronic components. It relates to, in particular, a process of manufacturing a composite structure comprising a single-crystal thin layer, for example, made of silicon carbide, positioned on a support substrate, and allowing a precise alignment on a crystallographic axis of the thin layer.

BACKGROUND

Interest in silicon carbide (SiC) has increased considerably over the last few years because this semiconductor material can increase the energy handling capability. SiC is increasingly widely used for the manufacture of innovative power devices to meet the needs of rising fields in electronics, such as, in particular, electric vehicles.

Power devices and integrated power supply systems based on single-crystal silicon carbide are able to manage a much higher power density in comparison with their conventional homologues made of silicon, and do so with smaller active-zone dimensions. In order to further limit the dimensions of power devices on SiC, it is advantageous to manufacture vertical instead of lateral components. For this, vertical electrical conduction, between an electrode positioned on the front face of the SiC structure and an electrode positioned on the back face, must be allowed by the structure.

Nevertheless, high-quality single-crystal SiC substrates intended for the microelectronics industry remain expensive and difficult to supply at a large size. It is thus advantageous to resort to thin-layer transfer solutions, to prepare composite structures typically comprising a thin layer of single-crystal SiC on a lower cost support substrate, whether this is single-crystal or polycrystalline. One well-known thin-layer transfer solution is the Smart Cut™ process, based on implanting light ions and on assembling by direct bonding. Such a process makes it possible, for example, to manufacture a composite structure comprising a thin layer of single-crystal SiC (c-SiC), removed from a donor substrate made of c-SiC with low defect density, assembled in direct contact or via a metallic layer with a support substrate made of polycrystalline SiC (p-SiC) or made of single-crystal SiC. Such a composite structure allows vertical electrical conduction.

Certain vertical electronic components manufactured on a composite structure as stated require a precise alignment relative to the crystallographic axes of the thin layer of c-SiC, in order to attain a high performance level. The required accuracy is typically ±0.1°. In practice, it is necessary to be able to align an element of the electronic component (for example, the gate along its length) with the crystallographic axis (11-20) of the c-SiC layer, to better than 0.1°.

Even though this problem of alignment has just been described with reference to the components produced on a thin layer made of SiC, it is potentially found with single-crystal thin layers comprising other materials.

It is therefore advantageous to provide a composite structure on which it is possible to find, in a reproducible manner, at least one crystallographic axis of the thin layer, so as to create alignment marks that are coherent with the axis and that can be used at all the levels of masks necessary, for the production of the vertical components.

The support substrate and the donor substrate used for the manufacture of the composite structure customarily each have a flat spot or a notch that indicates a crystallographic axis contained in the plane of the front face of the substrate, with an accuracy of ±1°.

Such an inaccuracy does not make it possible to rely on the flat spot or the notch of a substrate in order to define alignment marks representative of a crystallographic axis in a reproducible manner, with an accuracy of ±0.1°.

Adding to this the alignment inaccuracies during the assembly of the substrates, in order to form the composite structure, it clearly appears impossible to rely on the flat spot or the notch of the support substrate in order to define alignment marks representative of a crystallographic axis of the thin layer derived from the donor substrate.

In order to carry out accurate locating of a crystallographic axis, it would be necessary to use x-ray diffraction (XRD) tools, which greatly complicates the process for manufacturing the composite structure.

BRIEF SUMMARY

The present disclosure aims to resolve all or some of the aforementioned drawbacks. It relates to a process for manufacturing a composite structure comprising a single-crystal thin layer (for example, made of SiC) positioned on a support substrate, the composite structure allowing a precise alignment on a crystallographic axis of the thin layer.

The present disclosure relates to a process for manufacturing a composite structure comprising a thin layer made of a first single-crystal material positioned on a support substrate. The process comprises:
  a step a) of providing a donor substrate comprising the first single-crystal material having a front face and a back face,
  a step b) of providing a support substrate having a front face, a back face, an edge and a first alignment pattern on one of the faces or on the edge,
  a step c) of heat treatment applied at least to the donor substrate, under a controlled atmosphere and at a temperature capable of bringing about a surface reorganization on at least one of the faces of the substrate, the surface reorganization giving rise to the formation of first steps of nanometric amplitude, which are parallel to a first main axis,
  a step d) of assembling the donor substrate and the support substrate comprising, before the substrates are brought into contact, an optical alignment, to better than ±0.1°, between a locating mark indicating the first main axis on the donor substrate and at least one alignment pattern of the support substrate, and
  a step e) of transferring a thin layer from the donor substrate onto the support substrate.

According to other advantageous and non-limiting features of the present disclosure, taken alone or in any technically feasible combination:

the first alignment pattern of the support substrate is a flat spot or a notch made in its edge, and the optical alignment during the assembly step uses the first alignment pattern;

the first material is silicon carbide and the temperature of the heat treatment of step c) is greater than or equal to 1500° C., preferentially greater than or equal to 1600° C.;

the support substrate is made of single-crystal silicon carbide, and the heat treatment step is also applied to the support substrate and brings about a surface reorganization on at least one of the faces of the substrate, the surface reorganization giving rise to the formation of second steps of nanometric amplitude, which are parallel to a second main axis;

a second alignment pattern on the support substrate is formed by the second steps themselves, by at least one pattern defined by photolithography and etching on the front face of the support substrate starting from the second steps, or by at least one pattern defined by photolithography and etching on the back face of the support substrate starting from the second steps;

the optical alignment during the assembly step uses the second alignment pattern;

the first material is gallium arsenide and the temperature of the heat treatment of step c) is greater than or equal to 630° C.;

the first material is indium phosphide and the temperature of the heat treatment of step c) is greater than or equal to 600° C.;

the locating mark is formed by the first steps themselves, by at least one mark defined by photolithography and etching on the front face of the donor substrate starting from the first steps, or by at least one mark defined by photolithography and etching on the back face of the donor substrate starting from the first steps;

the assembly step comprises a chemical-mechanical polishing of the front face of the donor substrate and/or of the front face of the support substrate, before the two substrates are brought into contact;

the assembly step comprises the deposition of an intermediate layer on the front face of the donor substrate and/or on the front face of the support substrate, before the two substrates are brought into contact;

the manufacturing process comprises, before the assembly step, a step of forming a buried fragile plane in the donor substrate, delimiting the thin layer between the buried fragile plane and the front face of the donor substrate; and the manufacturing process comprises, during the transfer step, a separation along the buried fragile plane in order to form, on the one hand, the composite structure comprising the thin layer positioned on the support substrate and, on the other hand, the remainder of the donor substrate.

BRIEF DESCRIPTION OF THE DRAWINGS

Other features and advantages of the present disclosure will become apparent from the following detailed description of the present disclosure, which is given with reference to the accompanying figures, in which.

DETAILED DESCRIPTION

In the descriptive part, the same references in the figures can be used for elements of the same type. The figures are diagrammatic representations that, for the sake of readability, are not to scale. In particular, the thicknesses of the layers along the z-axis are not to scale with respect to the lateral dimensions along the x and y axes; and the relative thicknesses of the layers with respect to one another are not necessarily respected in the figures.

Figure 1:
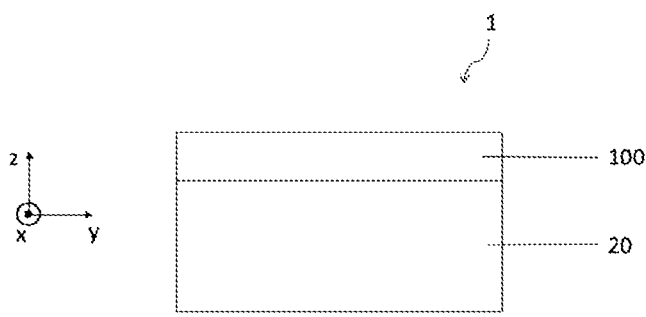
FIG. 1 shows a composite structure prepared according to a manufacturing process in accordance with the present disclosure.

The present disclosure relates to a process for manufacturing a composite structure 1 comprising a thin layer 100 made of a first single-crystal material positioned on a support substrate 20 (FIG. 1).

The first material could be, in particular, silicon carbide (SiC), gallium arsenide (GaAs), indium phosphide (InP), gallium nitride (GaN), aluminum nitride (AlN), silicon germanium (SiGe), silicon (Si), germanium (Ge) or others. In the remainder of the description, "c-SiC" or "c-material," in general, will be used to refer respectively to single-crystal silicon carbide or the material in single-crystal form.

Figure 2A:
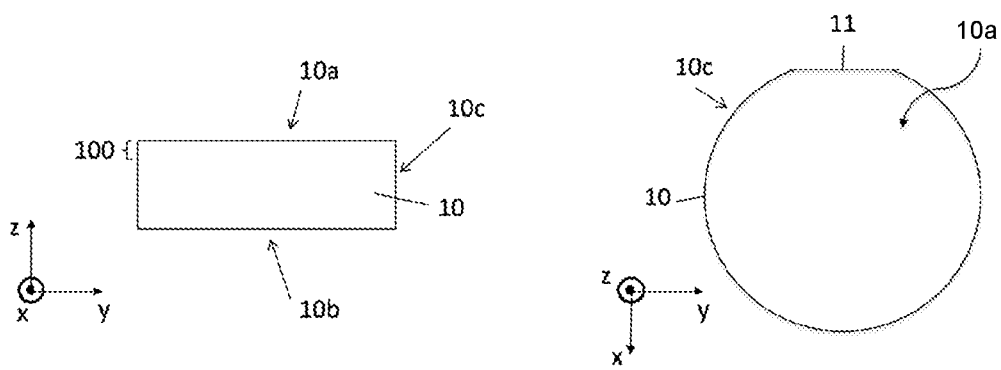
FIGS. 2A-2E show steps of a manufacturing process in accordance with the present disclosure.

The process first comprises a step a) of providing a donor substrate 10 comprising the first single-crystal material (FIG. 2A).

The thin layer 100 of the composite structure 1 will be formed, upon completion of the process of the present disclosure, starting from the donor substrate 10: thus, the crystallographic orientation, crystal quality and also the degree of doping of the donor substrate 10 are chosen so as to meet the required specifications of the components, for example, vertical components, intended to be produced on the thin layer 100.

By way of example, a donor substrate 10 made of c-SiC could be of 4H or 6H polytype, having an offcut angle of less than 4.0°±0.5° with respect to the <11-20> crystallographic axis, and a density of through dislocations (micropipes) of less than or equal to 5/cm$^2$, or even of less than 1/cm$^2$. In N-(nitrogen-)doped form, it has a resistivity preferentially of between 0.015 ohm·cm and 0.030 ohm·cm. A donor substrate 10 could be chosen that has a low density of basal plane dislocations (BPDs), typically less than or equal to 1500/cm$^2$ depending on the sensitivity of the targeted components to these defects.

Figure 3:
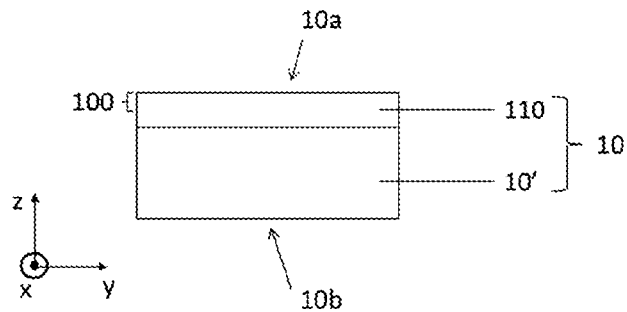
FIGS. 3-6C show alternative or optional steps of the manufacturing process in accordance with the present disclosure.

Alternatively, the c-SiC donor substrate 10 may have an initial substrate 10' and a surface layer 110 on the side of its front face 10a, produced by, for example, epitaxy, and having the required properties for the future thin layer 100; the latter will be formed, upon completion of the process of the present disclosure, starting from the surface layer 110 (FIG. 3). In this case, it is possible to envisage a density of BPD-type defects in the surface layer 110 of less than that of the initial substrate 10', and advantageously of less than 5/cm$^2$, or even less than 1/cm$^2$.

Still by way of example, a donor substrate 10 made of c-InP could have an offcut angle of 2°.

The donor substrate 10 is preferentially in the form of a circular wafer having a diameter of 100 mm or 150 mm, or even 200 mm, and a thickness typically of between 300 and 800 microns. It has a front face 10a, a back face 10b and an edge 10c forming its circular perimeter. The surface roughness of the front face 10a is advantageously chosen to be less than 1 nm Ra (average roughness), measured by atomic force microscopy (AFM) in a scan of 20 microns×20 microns.

The donor substrate 10 customarily comprises a flat spot 11 or a notch made in its edge 10c. In general, the flat spot 11 (or the notch) marks one particular crystallographic axis, contained in the plane (x,y) of the front face 10a: for a substrate made of c-SiC, the crystallographic axis (11-20) is, for example, parallel to the flat spot 11. Nevertheless the accuracy of this marking is low, since the flat spot 11 guarantees the direction of the crystallographic axis to ±1°.

According to another option, the donor substrate 10 may comprise one or more micrometric or millimetric patterns produced by the known techniques of lithography, etching and deposition on its front face 10a or on its back face 10b, and that are capable of indicating one particular crystallographic direction.

Figure 2B:
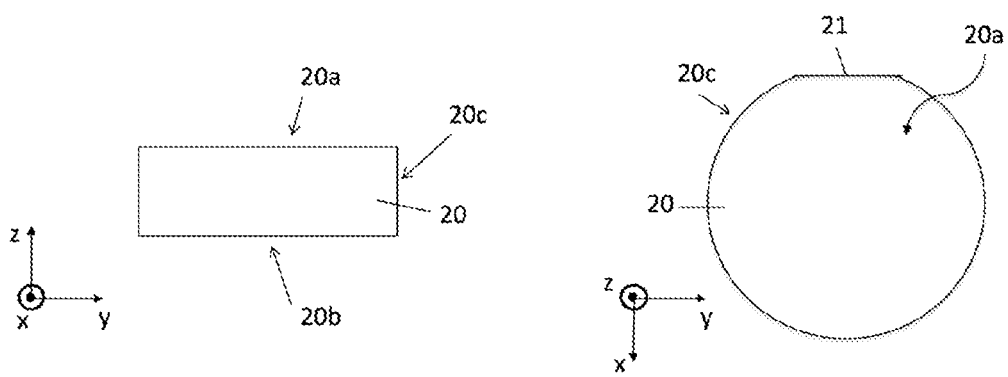

The process also comprises a step b) of providing a support substrate 20 (FIG. 2B). The latter may be chosen from any material compatible with the microelectronic processes customarily used to produce components based on the first material. The support substrate 20 could therefore be made of silicon, silicon carbide, gallium arsenide, indium phosphide, etc.

Advantageously, when the first material of the donor substrate (10) (and of the thin layer (100)) is silicon carbide, the support substrate 20 is made of polycrystalline silicon carbide (p-SiC) or made of single-crystal silicon carbide. In the latter case, a higher degree of defects and dislocations can be tolerated than for the donor substrate 10 (and the thin layer 100 that will be derived therefrom). Preferentially, the support substrate 20 has a resistivity of between 0.015 ohm·cm and 0.030 ohm·cm in order to meet the requirements of electrical conduction of the vertical components capable of being produced on the future composite structure 1.

The support substrate 20 is preferentially in the form of a circular wafer having a diameter of 100 mm or 150 mm, or even 200 mm, and a thickness typically of between 300 and 800 microns. It has a front face 20a, a back face 20b and an edge 20c forming its circular perimeter. The surface roughness of the front face 20a is advantageously chosen to be less than 1 nm Ra, like for the donor substrate 10.

The support substrate 20 generally comprises an alignment pattern 21 (referred to as first alignment pattern 21 hereinafter) that is positioned on one of the front 20a and back 20b faces or on the edge 20c. In FIG. 2B, the first alignment pattern 21 is a flat spot made in the edge 20c of the support substrate 20. Alternatively, the first alignment pattern may include a notch also made in the edge 20c. According to yet another option, the first alignment pattern 21 may include one or more micrometric or millimetric patterns produced by the known techniques of lithography, etching and deposition, on the front face 20a or on the back face 20b of the support substrate 20, and that are capable of indicating one particular direction or of acting as a marker for aligning levels of subsequent lithographic masks.

In the case of a single-crystal support substrate 20, the first alignment pattern 21 marks a crystallographic axis contained in the plane (x,y) parallel to the front face 20a of the substrate 20, as explained above for the donor substrate 10, with an accuracy of ±1°.

The process according to the present disclosure then comprises a step c) of heat treatment applied to the donor substrate 10 and optionally to the support substrate 20, under a controlled atmosphere and at a temperature capable of bringing about a surface reorganization on at least one of the faces of the treated substrate. The surface reorganization gives rise to the formation of steps (step bunching) that are parallel to one another and have a nanometric amplitude, for example, of the order of from several nanometers up to 500 nm.

Without being limiting, several examples of heat treatments are indicated below, for various types of first material.

When the first material is silicon carbide, the heat treatment of step c) is applied to the donor substrate 10 (and potentially to the support substrate 20, if it too is made of silicon carbide) at a temperature greater than or equal to 1500° C., preferentially greater than or equal to 1600° C. The temperature is typically chosen between 1500° C. and 1800° C., for example, 1700° C., and the atmosphere is advantageously inert or reducing, based on argon and/or on a mixture of argon and around 2% hydrogen. Such a temperature is high enough so that at least one compound of the silicon carbide (namely here the silicon) is capable of exodiffusing.

Applied to a c-SiC substrate, such a heat treatment brings about a surface reorganization on at least one of the faces of the substrate giving rise to the formation of steps that are parallel to one another and have a nanometric amplitude, of the order of from several nanometers up to 500 nm.

When the first material is gallium arsenide, the temperature of the heat treatment of step c) is chosen to be greater than or equal to 630° C., under an arsine atmosphere; the exodiffusion of the arsenic brings about the expected surface reorganization.

When the first material is indium phosphide, the temperature of the heat treatment of step c) is chosen to be greater than or equal to 600° C., under a phosphine atmosphere; it is then the phosphorus that tends to exodiffuse and the surface reorganization in the form of steps can take place.

In the examples mentioned and more generally whatever the first material of the donor substrate 10, the application of the heat treatment of step c), under a controlled atmosphere enables a reorganization of the surface in the form of steps and prevents (or limits) the appearance of holes (etch pits).

Figure 2C:
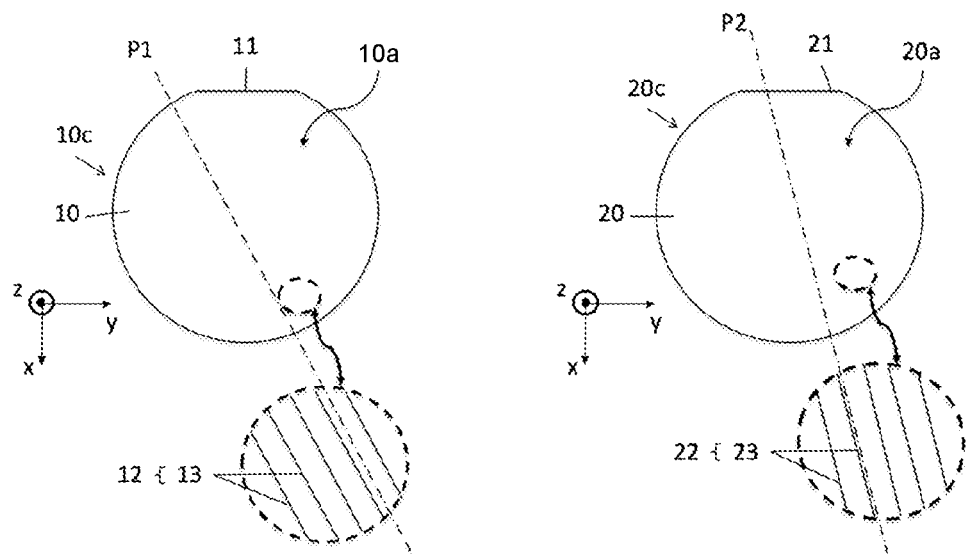

Thus, as illustrated in FIG. 2C, after the heat treatment step, the donor substrate 10 has steps 13 (referred to as first steps hereinafter) on its front face 10a and/or on its back face 10b that are all parallel to a main axis P1 (referred to as first main axis): this main axis P1 indicates a well-defined crystallographic axis, depending on the nature of the first material.

Namely, if the donor substrate 10 is made of c-SiC of 4H or 6H polytype, the main axis P1 is parallel to the crystallographic axis (1-100).

The presence of the first steps 13, on the front face 10a and/or on the back face 10b of the donor substrate 10, may constitute a locating mark 12 indicating the main axis P1, and consequently the associated crystallographic axis in the plane (x,y).

Figure 4:
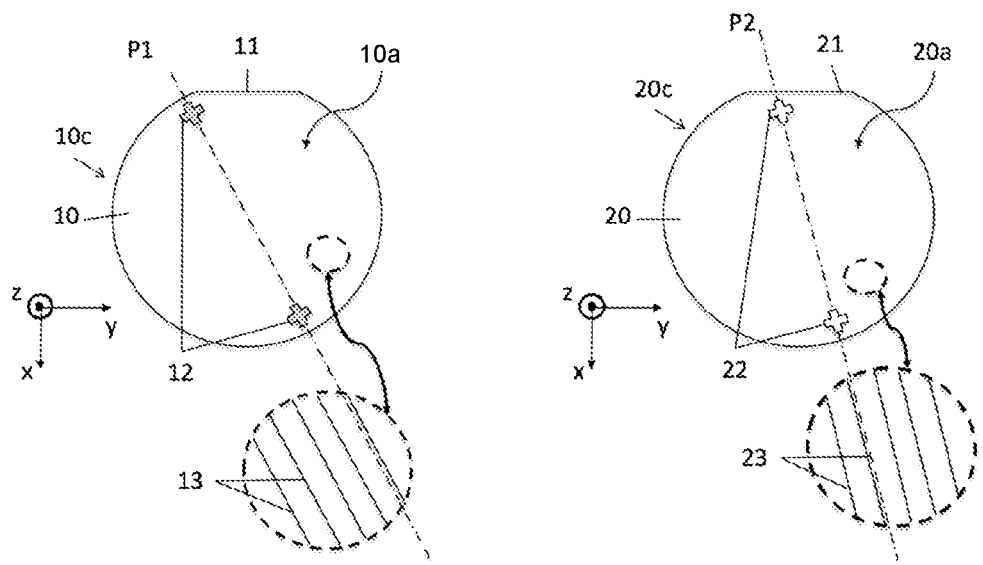

According to another option, the locating mark 12 is formed by at least one mark defined by the conventional techniques of photolithography and etching, on the front face 10a of the donor substrate 10, starting from the first steps 13 (FIG. 4).

According to yet another option, at least one mark is defined on the back face 10b of the donor substrate 10 starting from the first steps 13, thus forming the locating mark 12 on the back face 10b. This option is advantageous in that it prevents local structuring of the front face 10a of the donor substrate 10, which is favorable for a subsequent assembly step.

If the support substrate 20 comprises the first single-crystal material, like the donor substrate 10, the heat treatment step c) may also be applied thereto: steps 23 (referred to as second steps) are thus generated on its front face 20a and/or on its back face 20b, which are all parallel to a main axis P2 (referred to as second main axis): this main axis P2 indicates a well-defined crystallographic axis of the support substrate 20.

Note that a heat treatment step c) that is different (in terms of temperature and/or atmosphere) from that applied to the donor substrate 10 could be applied to the support substrate 20, if it comprises a single-crystal material different from the first material. The conditions of step c) would then be defined so as to bring about the desired surface reorganization on the support substrate 20.

As illustrated in FIG. 2C, the presence of the second steps 23, on the front face 20a and/or on the back face 20b of the support substrate 20, may constitute a second alignment pattern 22 indicating the main axis P2, and consequently the associated crystallographic axis in the plane (x,y).

According to another option, the second alignment pattern 22 is formed by at least one pattern (defined by the conventional techniques of photolithography and etching), on the front face 20a of the support substrate 20, starting from the second steps 23 (FIG. 4).

According to yet another option, at least one pattern is defined on the back face 20b of the support substrate 20 starting from the second steps 23, thus forming the second alignment pattern 22 on the back face 20b.

Note that it is possible to favor the appearance of the steps 13, 23 on one or the other of the faces of the substrate 10, 20 to which the heat treatment is applied. In particular, c-SiC of 4H polytype is polar and may have, as front face, an Si face or a C face: considering the different energy levels of these two faces, the surface reconstruction of an Si face will generate many more steps, of larger amplitude, than the reconstruction of a C face, under certain annealing conditions.

The process then comprises a step d) of assembling the donor substrate 10 and the support substrate 20, via their respective front faces 10a, 20a. This step comprises the intimate contacting of the two substrates 10, 20 to carry out a direct bonding, by molecular adhesion. As is well known per se, such bonding requires that the assembled surfaces be precleaned, in order to remove the contaminations (particles, organics, etc.), and potentially activated, in order to favor chemical surface terminations that are favorable to the propagation of the bonding wave and to the good strength of the bonding interface.

According to the present disclosure, before the substrates 10, 20 are brought into contact, an optical alignment, to better than ±0.1°, is carried out between a locating mark 12 indicating the first main axis P1 on the donor substrate 10 and at least one alignment pattern 21, 22 of the support substrate 20. The alignment between the locating mark 12 and the alignment pattern 21, 22 is targeted with an accuracy of better than ±0.1°, or even better than ±0.05°.

The objective of this alignment is to ensure that the first main axis P1 (corresponding to one particular crystallographic axis of the donor substrate 10, and therefore of the thin layer 100 that will be derived therefrom) is accurately marked by the first 21 or second 22 alignment pattern of the support substrate 20.

It is recalled that it is equally possible to carry out the optical alignment between marks or patterns positioned on the front faces 10a, 20a, the back faces 10b, 20b or the edges 10c, 20c of the donor 10 and support 20 substrates.

Figure 2D:
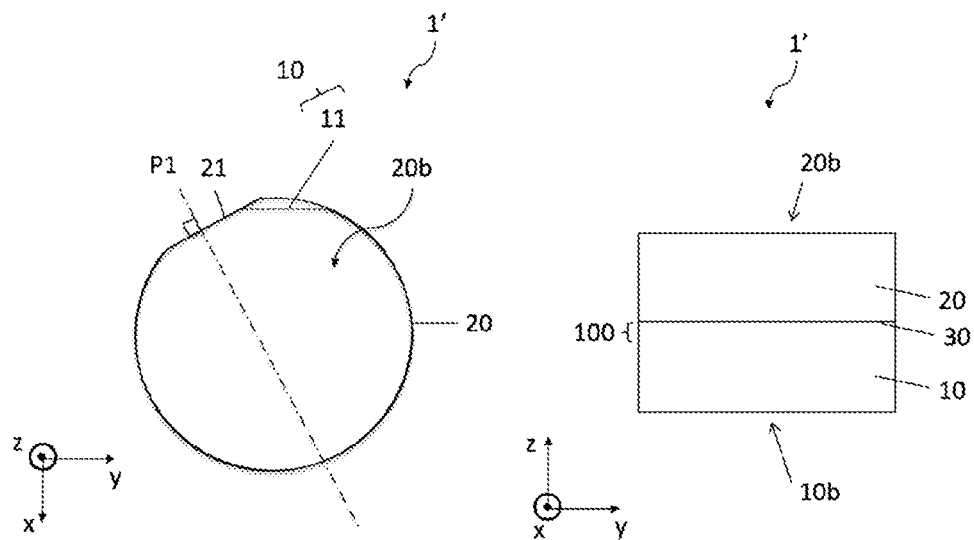

According to a first variant, the optical alignment is carried out between the locating mark 12, whatever it is, and the first alignment pattern 21 of the support substrate 20 (FIG. 2D). In such a case, it is not necessary for the support substrate 20 to have undergone the heat treatment step c) since a second alignment pattern 22, based on the second steps 23, is not used.

The first variant is advantageously used when the support substrate 20 comprises an amorphous or polycrystalline material, for example, p-SiC.

Figure 5:
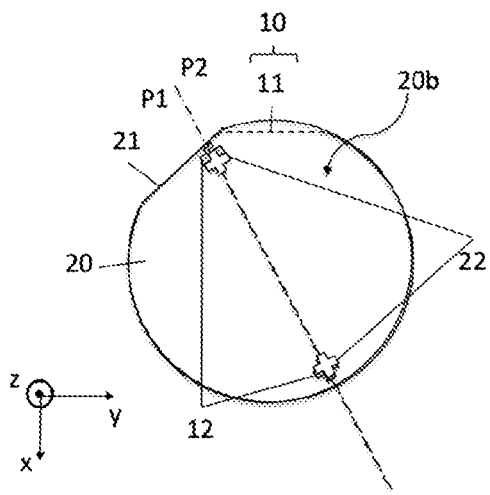

According to a second variant, the optical alignment is carried out between the locating mark 12, whatever it is, and the second alignment pattern 22 of the support substrate 20, whatever it is (FIG. 5). In such a case, the heat treatment of step c) was applied to the support substrate 20, so as to generate the second steps 23 required to form a second alignment pattern 22. This second variant is advantageously used when the support substrate 20 comprises a single-crystal material, for example, c-SiC. It is also preferred in the case where the future composite structure 1 is intended for the production of vertical components. Indeed, for these components, it is advantageous to directly assemble the semiconductor surfaces (for example, made of c-SiC) of each of the substrates 10, 20 (for example, via a hydrophobic direct bonding); however it is noted that a misalignment of more than 0.2° between the crystallographic axes contained in the plane (x,y) of the donor substrate 10 and the crystallographic axes contained in the plane (x,y) of the support substrate 20 increases the resistivity of the assembly interface, which is unfavorable to the vertical electrical conduction of the components. It is therefore advantageous to be able to align the crystallographic axes of the two substrates 10, 20 to ±0.1° during the assembly, as is provided by the process according to the present disclosure.

Step d) of assembling the substrates 10, 20 may comprise a surface treatment in order to smooth one or the other of the front faces 10a, 20a of the donor 10 and support 20 substrates prior to the contacting thereof. Indeed, the presence of steps 13 on at least the front face 10a of the donor substrate 10 may affect the quality of the direct bonding. The principles mentioned below with reference to the donor substrate 10 apply in a similar manner when second steps 23 are present on the front face of the support substrate 20.

Thus, a chemical-mechanical polishing of the front face 10a of the donor substrate 10 may be carried out, for example, before the optical alignment and the contacting of the two substrates 10, 20. Since the polishing results in the first steps 13 disappearing, it is necessary for a locating mark 12 on the donor substrate 10 (or a second alignment pattern 22 on the support substrate 20) to have been made from the steps 13 before the polishing. Alternatively, even though the first steps 13 are removed on the front face 10a, steps 13 present on the back face 10b of the donor substrate 10 may be used to produce a locating mark 12 or directly for the optical alignment.

Still prior to the optical alignment and the contacting, the assembly step d) may also comprise the deposition of an intermediate layer on the front face 10a of the donor substrate 10 and/or on the front face 20a of the support substrate 20. The intermediate layer may be an insulating or electrically conductive layer, for example, a metallic layer, depending on the type of component that will be produced on the composite structure 1 at the end of the process according to the present disclosure. The insulating layer may comprise a material chosen from silicon oxide, silicon nitride, etc.; the conductive layer may comprise a material chosen from tungsten (W), tungsten silicides (WSi2), titanium (Ti), nickel (Ni), silicon carbonitrides (SiCNx with x=10%, for example), etc. The intermediate layer may also be smoothed by, for example, chemical-mechanical polishing, to facilitate the direct bonding of the substrates 10, 20. The steps 13, 23 on the front faces 10a, 20a of the donor 10 and support 20 substrates are thus encapsulated and do not hamper the assembly.

During the assembly step d), the contacting of the substrates 10, 20 may be carried out under ambient atmosphere or under a controlled atmosphere, for example, under inert gas and/or under vacuum. It may also be carried out at a controlled temperature, for example, between 20° C. and 300° C.

As is well known per se, the contacting of the substrates 10, 20 is accompanied by the propagation of a bonding wave, creating a bonding interface 30 and leading to a bonded assembly 1' (FIG. 2D).

Figure 2E:
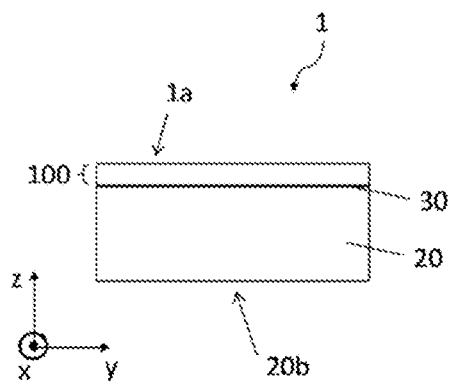

The manufacturing process according to the present disclosure lastly comprises a step e) of transferring a thin layer 100 from the donor substrate 10 onto the support substrate 20 (FIG. 2E).

According to a first embodiment, the transfer of the thin layer 100 is carried out by thinning of the back face 10b of the donor substrate 10, down to the desired thickness of the thin layer 100. Such a thinning may use, for example, conventional techniques of grinding, wet or dry chemical etching and/or chemical-mechanical polishing, in alternation with cleaning sequences. One (or more) heat treatment(s) may be applied to consolidate the bonding interface or else to improve the crystal and/or surface quality of the thin layer 100.

Figure 6A:
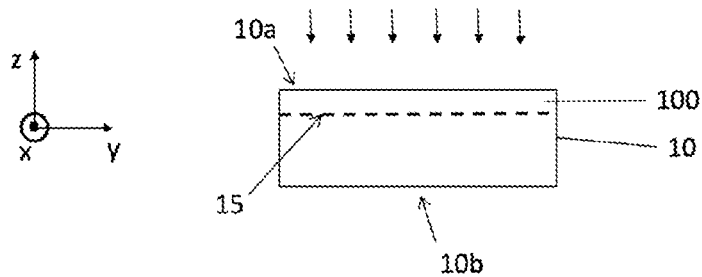

According to a second embodiment, the transfer of the thin layer 100 is carried out by the Smart Cut™ process. In this case, the manufacturing process according to the present disclosure comprises, before the assembly step, a step of forming a buried fragile plane 15 in the donor substrate 10, delimiting the thin layer 100 between the buried fragile plane 15 and the front face 10a of the donor substrate 10 (FIG. 6A).

Advantageously, a step of ion implantation of light species is carried out to a given depth in the donor substrate 10. The implanted light species are preferentially hydrogen, helium or these two species co-implanted. These light species will form, around the given depth, microcavities distributed in a thin layer parallel to the free surface of the donor substrate 10, i.e., parallel to the plane (x,y) in FIG. 6A. This thin layer is referred to as the buried fragile plane 15, for the sake of simplicity. The energy of implantation of the light species is chosen so as to reach the given depth in the donor substrate 10, the depth corresponding to a target thickness of the thin layer 100 after transfer. For example, hydrogen ions will be implanted at an energy of between 10 keV and 250 keV (or even up to 500 keV), and at a dose of between $5^E16/cm^2$ and $1^E17/cm^2$, to delimit a thin layer 100 of the order of 100 to 1500 nm.

It should be noted that a protective layer could be deposited on the front face 10a of the donor substrate 10 prior to the ion implantation step. This protective layer may comprise a material such as silicon oxide or silicon nitride.

Figure 6B:
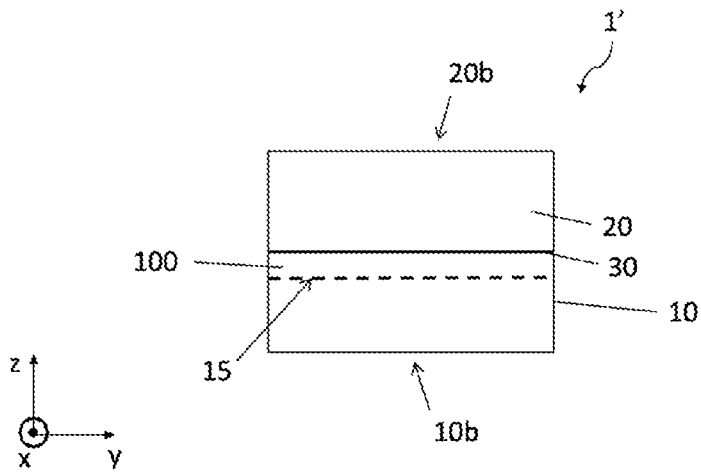
Figure 6C:
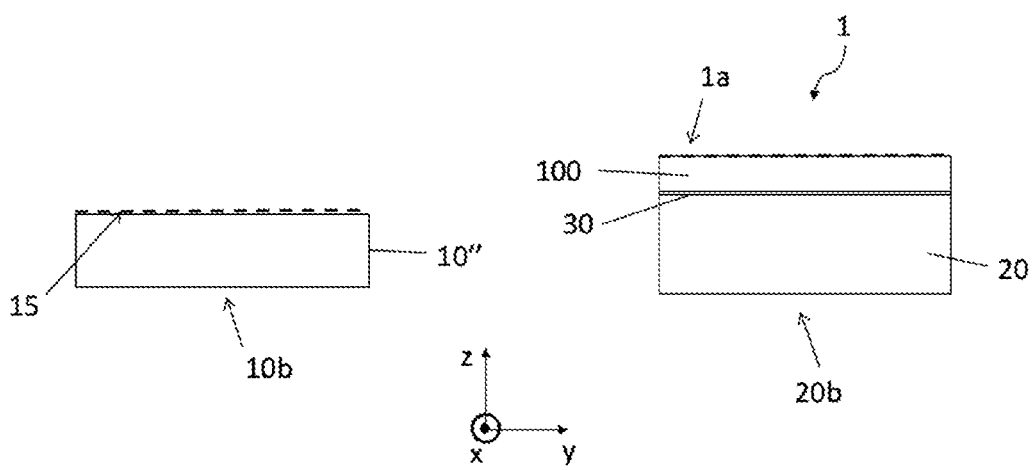

Still in the second embodiment, the assembly step d) previously described is then carried out (FIG. 6B). Then, the transfer step e) comprises a separation along the buried fragile plane 15, in order to form, on the one hand, the composite structure 1 comprising the thin layer 100 positioned on the support substrate 20 and, on the other hand, the remainder 10" of the donor substrate.

The separation can be induced by application of a heat treatment at a temperature typically between 200° ° C. and 1000° ° C., for several minutes to several hours; in particular, a temperature between 800° C. and 1000° C. in the case of a first material made of c-SiC, or between 200° C. and 300° C. in the case of a first material made of c-GaAs, or else around 300° C. in the case of a first material made of c-InP. During the heat treatment, the microcavities present in the buried fragile plane 15 follow growth kinetics until the spontaneous initiation of a fracture wave, which will propagate over the entire extent of the buried fragile plane 15 and result in the separation between the composite structure 1 and the remainder 10" of the donor substrate 10.

Alternatively, the separation may be induced by application of a localized stress, or by a combination of heat treatment and mechanical stress.

After the separation, the free face of the thin layer 100 typically exhibits a roughness of between 3 and 6 nm Ra (AFM—20 micron×20 micron scan). The objective for the subsequent production of components is to have a roughness of less than 1 nm Ra.

Thus, after the transfer step e), the manufacturing process may comprise finishing steps applied to the composite structure 1. These finishing steps aim, in particular, to improve the roughness of the free surface of the thin layer 100 (front face 1a of the composite structure 1).

The finishing steps may make use of, in particular, known techniques of chemical-mechanical polishing, applied to the front face 1a. They may also comprise heat treatments that aim to consolidate the bonding interface 30 or else to improve the crystal and/or surface quality of the thin layer 100.

Whichever embodiment is chosen, at the end of the transfer step e) the locating mark 12 of the donor substrate 10 is either absent from the composite structure 1 (in particular, if it was located on the back face 10b of the donor substrate 10) or invisible or degraded (if it was located on the front face 10a or the edge 10c of the donor substrate 10).

Thus, in order to produce components on or in the thin layer 100 while being aligned on a particular crystallographic axis of the layer 100, it is possible to rely on the alignment pattern 21, 22 of the support substrate 20 that was used for the optical alignment of the assembly step d). This alignment pattern indicates with great accuracy (±0.1°) the direction of the particular crystallographic axis of the thin layer 100.

EXAMPLE

According to a non-limiting implementation example, the donor substrate 10 provided in step a) of the manufacturing process is a wafer made of c-SiC of 4H polytype, with an orientation of 4.0°±0.5° relative to the <11-20> axis, with a diameter of 150 mm and a thickness of 350 µm. The front face 10a of the donor substrate 10 is a face of C (carbon) type, whereas its back face 10b is of Si (silicon) type. The donor substrate 10 may comprise a flat spot 11 made in its edge 10c and indicating, to within +1°, the crystallographic direction (1-100) contained in the plane (x,y) of the front face 10a of the substrate 10.

The support substrate 20 provided in step b) of the manufacturing process is a wafer made of c-SiC of 4H polytype, with an orientation of 4.0°+0.5° relative to the <11-20> axis, with a diameter of 150 mm and a thickness of 350 μm. The support substrate 20 comprises a flat spot 11 made in its edge 20c and indicating the crystallographic direction (1-100) contained in the plane (x,y) of the front face 20a of the substrate 20. The front face 20a is of Si type and the back face 20b is of C type.

A conventional cleaning sequence is carried out on the substrates 10, 20 prior to the heat treatment step c).

The heat treatment at 1700° C. under argon or under argon combined with 2% hydrogen is then applied to the two substrates 10, 20, resulting in the appearance of first steps 13 on the faces 10a, 10b of the donor substrate 10 and of second steps 23 on the faces 20a, 20b of the support substrate 20. Considering the various energies required by the Si type faces and the C type faces for the surface reorganization, the first steps 13 on the donor substrate 10 are of greater amplitude on its back face 10b (Si face) than on its front face 10a (C face); and the second steps 23 on the support substrate 20 are of greater amplitude on its front face 20a (Si face) than on its back face (C face). Since the donor substrate 10 and the support substrate 20 are of the same kind and same crystalline orientation, the first main axis P1 and the second main axis P2, which are respectively parallel to the first steps 13 and to the second steps 23, correspond to the same crystallographic axis (1-100).

Starting from the first steps 13 on the back face 10b of the donor substrate 10, a locating mark 12 is defined on the back face 10b. Starting from the second steps 23 on the front face 20a of the support substrate 20, a second alignment pattern 22 is defined on the back face 20b of the substrate 20. It is recalled that the mark 12 and the second pattern 22 are made so as to accurately indicate the direction, respectively, of the first (P1) and second (P2) main axis. They may each include two alignment crosses, positioned at the border of the associated substrate.

Hydrogen ions are implanted at an energy of 60 keV and a dose of $6^{E16}$ H+/cm² through the front face 10a of the donor substrate 10. Optionally, the donor substrate 10 may comprise a protective layer on its front face 10a, through which the ions are implanted. A buried fragile plane 15 is created at a depth of about 500 nm in the donor substrate 10.

The assembly step d) comprises a chemical-mechanical polishing of the front faces 10a, 20a of the substrates 10, 20, in order to remove the steps 13, 23 generated during step c) and restore a good surface finish and a roughness of less than 0.2 nm rms, favorable to a quality assembly. Note that the aforementioned protective layer, if it is present, will be removed prior to the polishing.

The substrates 10, 20 are then introduced into bonding equipment provided with an alignment module allowing an optical alignment to better than ±0.1°. The locating mark 12 on the back face 10b of the donor substrate 10 and the second alignment pattern 22 on the back face 20b of the support substrate 20 are used for this optical alignment between the substrates. The crystallographic axes (1-100) of the two substrates 10, 20 will thus be aligned to better than ±0.1°. In other words, after the assembly, the crystallographic axis (1-100) of the donor substrate 10 could be offset relative to the crystallographic axis (1-100) of the support substrate 20 by at most 0.1°.

The assembly is then carried out by bringing the two substrates, which are aligned relative to one another, into contact under an inert atmosphere (Ar or N) and under vacuum (<$1^{E-8}$ Pa).

The transfer step e) is carried out by application of annealing at 950° C. for 30 min: a spontaneous separation along the buried fragile plane takes place, giving rise to the composite structure 1 and to the remainder 10" of the donor substrate.

The second alignment pattern 22, present on the back face 20b of the support substrate 20 (which is also the back face of the composite structure 1), indicates precisely, to within ±0.1° (or better), the direction of the crystallographic axis (1-100) of the thin layer 100 and may be easily used during the production of components on the layer 100 of the composite structure 1.

Of course, the present disclosure is not limited to the embodiments and to the examples described, and alternative embodiments may be introduced thereto without departing from the scope of the invention as defined by the claims.

The invention claimed is:

1. A method for manufacturing a composite structure comprising a thin layer of a first single-crystal material on a support substrate, the method comprising:
   providing a donor substrate comprising the first single-crystal material having a front face and a back face;
   providing a support substrate having a front face, a back face, an edge and a first alignment pattern on one of the faces or on the edge; thereof;
   applying a heat treatment at least to the donor substrate, under a controlled atmosphere and at a temperature capable of bringing about a surface reorganization on at least one of the faces of the donor substrate, the surface reorganization resulting in formation of first steps of nanometric amplitude, the first steps oriented parallel to a first main axis;
   assembling the donor substrate and the support substrate comprising, before bringing the substrates into contact, optically aligning, to better than ±0.1°, a locating mark indicating the first main axis on the donor substrate relative to at least one alignment pattern of the support substrate; and
   transferring the thin layer from the donor substrate onto the support substrate.

2. The method of claim 1, wherein:
   the first alignment pattern of the support substrate is a flat spot or a notch made in its the edge of the support substrate; and
   the optically aligning of the location mark relative to the at least one alignment pattern comprises using the first alignment pattern.

3. The method of claim 2, wherein the first material is silicon carbide and the temperature of the heat treatment is greater than or equal to 1500° C.

4. The method of claim 3, wherein:
   the support substrate comprises single-crystal silicon carbide;
   the heat treatment is also applied to the support substrate and brings about a surface reorganization on at least one of the faces of the support substrate, the surface reorganization giving rise to formation of second steps of nanometric amplitude, the second steps oriented parallel to a second main axis;
   a second alignment pattern on the support substrate is formed by the second steps themselves, by at least one pattern defined by photolithography and etching on the front face of the support substrate starting from the second steps, or by at least one pattern defined by photolithography and etching on the back face of the support substrate starting from the second steps; and
   the optical alignment during the assembly step uses the second alignment pattern.

5. The method of claim 2, wherein the first material is gallium arsenide and the temperature of the heat treatment is greater than or equal to 630° C.

6. The method of claim 2, wherein the first material is indium phosphide and in which the temperature of the heat treatment is greater than or equal to 600° C.

7. The method of claim 1, wherein the locating mark is formed by the first steps themselves, by at least one mark defined by photolithography and etching on the front face of the donor substrate starting from the first steps, or by at least one mark defined by photolithography and etching on the back face of the donor substrate starting from the first steps.

8. The method of claim 1, further comprising a chemical-mechanical polishing of the front face of the donor substrate and/or of the front face of the support substrate, before the two substrates are brought into contact.

9. The method of claim 1, further comprising depositing an intermediate layer on the front face of the donor substrate and/or on the front face of the support substrate, before the two substrates are brought into contact.

10. The method of claim 1, further comprising:
before the assembling, forming a buried fragile plane in the donor substrate, delimiting the thin layer between the buried fragile plane and the front face of the donor substrate; and
during the transferring, a separation along the buried fragile plane to form the composite structure comprising the thin layer on the support substrate and a remainder of the donor substrate.

11. The method of claim 3, wherein the temperature of the heat treatment is greater than or equal to 1600° C.

12. The method of claim 1, wherein the first material is silicon carbide and the temperature of the heat treatment is greater than or equal to 1500° C.

13. The method of claim 12, wherein:
the support substrate comprises single-crystal silicon carbide;
the heat treatment is also applied to the support substrate and brings about a surface reorganization on at least one of the faces of the support substrate, the surface reorganization giving rise to formation of second steps of nanometric amplitude, the second steps oriented parallel to a second main axis;
a second alignment pattern on the support substrate is formed by the second steps themselves, by at least one pattern defined by photolithography and etching on the front face of the support substrate starting from the second steps, or by at least one pattern defined by photolithography and etching on the back face of the support substrate starting from the second steps; and
the optical alignment during the assembly step uses the second alignment pattern.

14. The method of claim 1, wherein the first material is gallium arsenide and the temperature of the heat treatment is greater than or equal to 630° C.

15. The method of claim 1, wherein the first material is indium phosphide and the temperature of the heat treatment is greater than or equal to 600° C.

* * * * *